United States Patent
Saito et al.

(10) Patent No.: US 9,711,684 B2
(45) Date of Patent: Jul. 18, 2017

(54) GROUP III NITRIDE SEMICONDUCTOR LIGHT-EMITTING DEVICE AND PRODUCTION METHOD THEREFOR

(71) Applicant: TOYODA GOSEI CO., LTD., Kiyosu-shi (JP)

(72) Inventors: Yoshiki Saito, Kiyosu (JP); Misato Boyama, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/059,178

(22) Filed: Mar. 2, 2016

(65) Prior Publication Data
US 2016/0260868 A1 Sep. 8, 2016

(30) Foreign Application Priority Data
Mar. 6, 2015 (JP) ................. 2015-044997

(51) Int. Cl.
| | |
|---|---|
| *H01L 29/06* | (2006.01) |
| *H01L 33/14* | (2010.01) |
| *H01L 33/32* | (2010.01) |
| *H01L 33/00* | (2010.01) |
| *H01L 33/20* | (2010.01) |

(52) U.S. Cl.
CPC .......... *H01L 33/145* (2013.01); *H01L 33/007* (2013.01); *H01L 33/20* (2013.01); *H01L 33/32* (2013.01)

(58) Field of Classification Search
CPC ....... H01L 33/32; H01L 33/007; H01L 33/20; H01L 2224/48091; H01L 2924/0002; H01L 33/12; H01L 33/0075; H01L 33/02; H01L 21/0242; H01L 21/0254; H01L 21/0262; H01L 2924/00; H01L 2924/00014
See application file for complete search history.

(56) References Cited

FOREIGN PATENT DOCUMENTS

JP 2002-368269 A 12/2002

*Primary Examiner* — Robert Bachner
(74) *Attorney, Agent, or Firm* — McGinn IP Law Group, PLLC

(57) ABSTRACT

There is provided a Group III nitride semiconductor light-emitting device in which electrons and holes are suppressed to be captured by threading dislocation, and a production method therefor. The light-emitting device comprises an n-type semiconductor layer, a light-emitting layer on the n-type semiconductor layer, a p-type semiconductor layer on the light-emitting layer. The light-emitting device has a plurality of pits extending from the n-type semiconductor layer to the p-type semiconductor layer. The n-type semiconductor layer includes an n-side electrostatic breakdown preventing layer. The n-side electrostatic breakdown preventing layer comprises an n-type GaN layer containing starting point of the pits, and an ud-GaN layer disposed adjacent to the n-type GaN layer and containing a part of the pits. At least one of the n-type GaN layer and the ud-GaN layer has an In-doped layer. The In composition ratio of the In-doped layer is more than 0 and not more than 0.0035.

14 Claims, 7 Drawing Sheets

GROUP III NITRIDE SEMICONDUCTOR LIGHT-EMITTING DEVICE AND PRODUCTION METHOD THEREFOR

BACKGROUND OF THE INVENTION

Field of the Invention

The present invention relates to a Group III nitride semiconductor light-emitting device and a production method therefor, more specifically, to a method for producing a Group III nitride semiconductor light-emitting device having pits.

Background Art

A Group III nitride semiconductor light-emitting device comprises a light-emitting layer which emits light through recombination of electrons and holes, an n-type semiconductor layer, and a p-type semiconductor layer. When producing the Group III nitride semiconductor light-emitting device, a semiconductor layer is epitaxially grown on a substrate. In this case, threading dislocation occurs in the semiconductor layer due to lattice mismatch between the substrate and the semiconductor layer. In the threading dislocation, non-light-emitting recombination of electrons and holes occurs. Non-light-emitting recombination refers to a recombination of electrons and holes which generates not light but heat. Therefore, electrons existing in the vicinity of the threading dislocation may cause non-light-emitting recombination at the threading dislocation. The more frequently non-light-emitting recombination occurs, the more heat the semiconductor light-emitting device generates. The emission efficiency of the semiconductor light-emitting device is decreased by the amount of the generated heat.

Therefore, the technique has been developed to suppress non-light-emitting recombination in the threading dislocation. For example, Patent document 1 discloses the technique to generate pits due to threading dislocation on the n-type GaN layer (refer to paragraphs [0014] to [0016] of Patent Document 1). In the technique, pits are filled with an AlGaN barrier layer. Therefore, the AlGaN barrier layer serves as a barrier so that electrons and holes are hardly reach the threading dislocation (refer to paragraph of Patent Document 1). As a result, the semiconductor light-emitting device exhibits high emission efficiency.

Patent Document 1: Japanese Patent Application Laid-Open (kokai) No. 2002-368269

In this way, the emission efficiency of the semiconductor light-emitting device has been improved through research and development. However, to improve the emission efficiency, it is required that electrons and holes are not further captured by threading dislocation.

SUMMARY OF THE INVENTION

The present invention has been conceived to solve the foregoing problems in the prior art. It is therefore an object of the present invention to provide a Group III nitride semiconductor light-emitting device in which electrons and holes are suppressed to be captured by threading dislocation, and a production method therefor.

In a first aspect of the present techniques, there is provided a Group III nitride semiconductor light-emitting device comprising an n-type semiconductor layer, a light-emitting layer on the n-type semiconductor layer, and a p-type semiconductor layer on the light-emitting layer. The Group III nitride semiconductor light-emitting device has a plurality of pits extending from the n-type semiconductor layer to the p-type semiconductor layer. The n-type semiconductor layer includes a first semiconductor layer containing starting points of the pits, and a second semiconductor layer disposed adjacent to the first semiconductor layer and containing a part of the pits. At least one of the first semiconductor layer and the second semiconductor layer has an In-doped layer of Group III nitride semiconductor. The In-doped layer has an In composition ratio of more than 0 and not more than 0.0035

In the Group III nitride semiconductor light-emitting device, a potential barrier is formed by In doping. Therefore, the existence probability of electrons and holes is low in the vicinity of threading dislocation. Non-light-emitting recombination is suppressed in the threading dislocation. Moreover, the surface flatness of the semiconductor layer is improved by the surfactant effect of In atoms. Thereby, the semiconductor light-emitting device exhibiting superior emission efficiency is achieved. The drive voltage of the semiconductor light-emitting device is low depending on the In-doped region.

A second aspect of the techniques is directed to a specific embodiment of the Group III nitride semiconductor light-emitting device, wherein the n-type semiconductor layer includes an n-side electrostatic breakdown preventing layer. The n-side electrostatic breakdown preventing layer has a first semiconductor layer and a second semiconductor layer. The first semiconductor layer is an n-type GaN layer. The second semiconductor layer is an ud-GaN layer, i.e., undoped GaN layer.

A third aspect of the techniques is directed to a specific embodiment of the Group III nitride semiconductor light-emitting device, wherein the first semiconductor layer and the second semiconductor layer have a pit formation region in which the pits are formed. The pit formation region comprises a first region, a second region, and a third region obtained by dividing the pit formation region into three equal regions in a thickness direction. The first region is the region farthest from the light-emitting layer. The second region is the region farthest next to the first region from the light-emitting layer. The third region is the region farthest next to the second region from the light-emitting layer. The In-doped layer is the first region.

A fourth aspect of the techniques is directed to a specific embodiment of the Group III nitride semiconductor light-emitting device, wherein the first semiconductor layer and the second semiconductor layer have a pit formation region in which the pits are formed. The pit formation region comprises a first region, a second region, and a third region obtained by dividing the pit formation region into three equal regions in a thickness direction. The first region is the region farthest from the light-emitting layer. The second region is the region farthest next to the first region from the light-emitting layer. The third region is the region farthest next to the second region from the light-emitting layer. The In-doped layer is the second region.

A fifth aspect of the techniques is directed to a specific embodiment of the Group III nitride semiconductor light-emitting device, wherein the first semiconductor layer and the second semiconductor layer have a pit formation region in which the pits are formed. The pit formation region comprises a first region, a second region, and a third region obtained by dividing the pit formation region into three equal regions in a thickness direction. The first region is the region farthest from the light-emitting layer. The second region is the region farthest next to the first region from the light-emitting layer. The third region is the region farthest next to the second region from the light-emitting layer. The In-doped layer is the third region.

A sixth aspect of the techniques is directed to a specific embodiment of the Group III nitride semiconductor light-emitting device, wherein the first end surface in a thickness direction of the In-doped layer is a surface containing the starting points of the pits in the first semiconductor layer. The second end surface in a thickness direction of the In-doped layer is inside the second semiconductor layer. The thickness of the In-doped layer in the second semiconductor layer is 100 nm to 200 nm. The pits are grown with the points at almost the same depths in the first semiconductor layer as the starting points. The pits may be shifted only by 0 nm to 10 nm in a thickness direction when viewed from a representative pit of the pits. The surface containing the starting points of the pits may be shifted only by 0 nm to 10 nm in a thickness direction from the position of the pit observed.

A seventh aspect of the techniques is directed to a specific embodiment of the Group III nitride semiconductor light-emitting device, wherein the first end surface in a thickness direction of the In-doped layer is a surface containing the starting points of the pits in the first semiconductor layer. The second end surface in a thickness direction of the In-doped layer is inside the second semiconductor layer. The thickness of the In-doped layer in the second semiconductor layer is 200 nm to 300 nm.

In an eighth aspect of the present techniques, there is provided a method for producing a Group III nitride semiconductor light-emitting device comprising an n-type semiconductor layer, a light-emitting layer on the n-type semiconductor layer, and a p-type semiconductor layer on the light-emitting layer. In the production method, a plurality of pits extending from the n-type semiconductor layer to the p-type semiconductor layer are formed. Then, when growing a semiconductor layer, a first semiconductor layer containing the starting points of the pits and a second semiconductor layer disposed adjacent to the first semiconductor layer and containing a part of the pits are formed as the n-type semiconductor layer. Moreover, an In-doped layer of Group III nitride semiconductor is formed as at least of the first semiconductor layer and the second semiconductor layer. The In composition ratio of the In-doped layer is more than 0 and not more than 0.0035.

The present specification provides a Group III nitride semiconductor light-emitting device in which electrons and holes are suppressed to be captured by threading dislocation, and a production method therefor.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
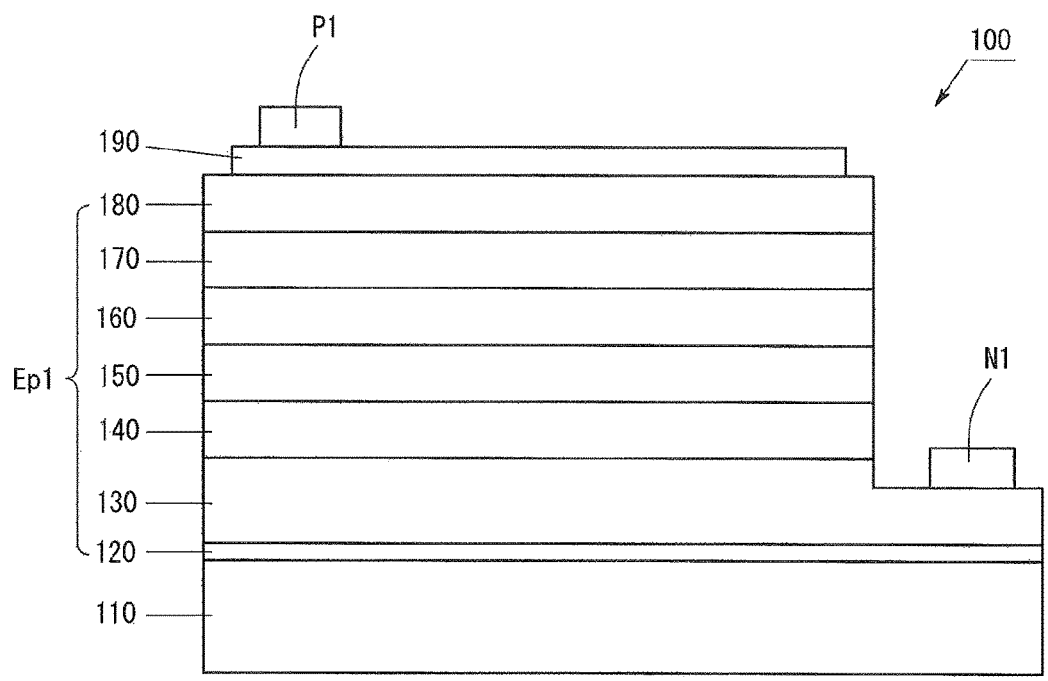
FIG. 1 is a sketch showing the structure of a light-emitting device according to an embodiment.

With reference to the drawings, specific embodiment of the production method for producing a semiconductor light-emitting device as an example will next be described in detail. However, this embodiment should not be construed as limiting the techniques thereto. The below-described depositing structure of the layers of the semiconductor light-emitting device and the electrode structure are given only for the illustration purpose, and other depositing structures differing therefrom may also be employed. The thickness of each of the layers shown in the drawings is not an actual value, but a conceptual value. The pit sizes described later are shown larger than the actual ones in the drawings.

1. Semiconductor Light-Emitting Device

Figure 2:
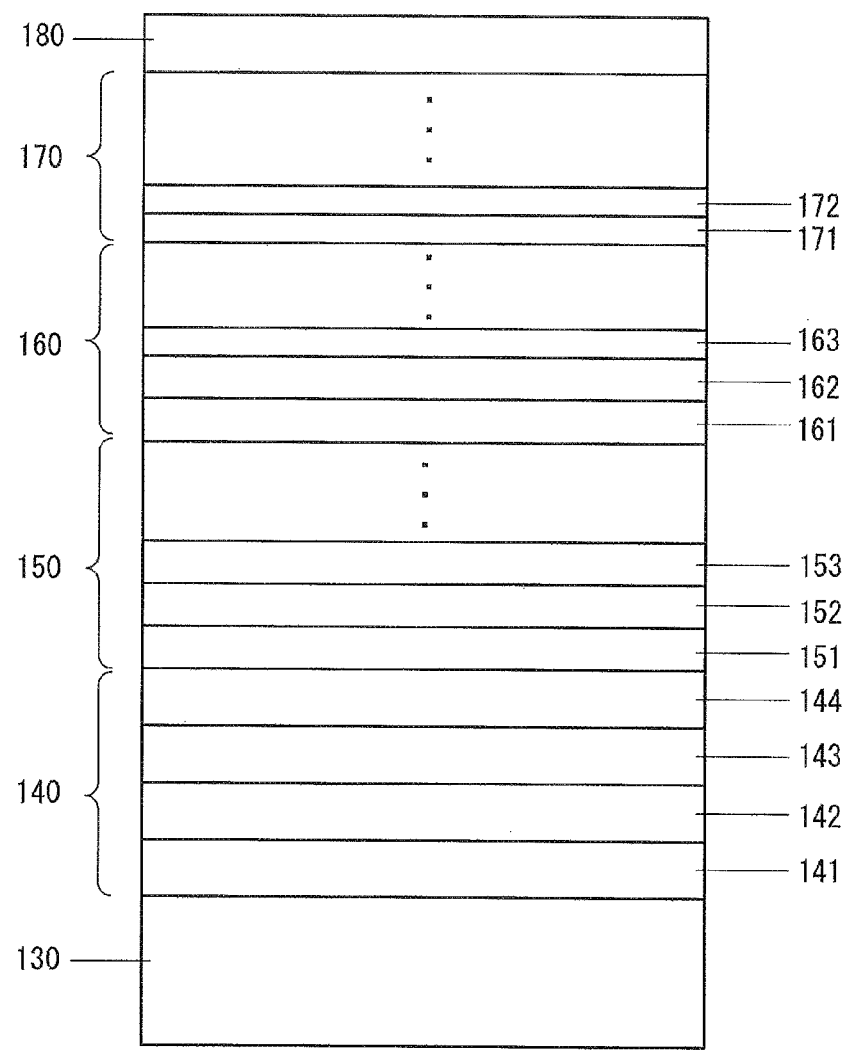
FIG. 2 is a sketch showing the layered structure of semiconductor layers in the light-emitting device according to the embodiment.

FIG. 1 is a sketch showing the structure of a light-emitting device 100 according to the present embodiment. FIG. 2 is a sketch showing the layered structure of semiconductor layers in the light-emitting device 100. The light-emitting device 100 is a face-up type semiconductor light-emitting device. The light-emitting device 100 has a plurality of Group III nitride semiconductor layers.

As shown in FIG. 1, the light-emitting device 100 comprises a substrate 110, a low-temperature buffer layer 120, an n-type contact layer 130, an n-side electrostatic breakdown preventing layer 140, an n-side superlattice layer 150, a light-emitting layer 160, a p-type cladding layer 170, a p-type contact layer 180, a transparent electrode 190, an n-electrode N1, and a p-electrode P1. The low-temperature buffer layer 120, the n-type contact layer 130, the n-side electrostatic breakdown preventing layer 140, the n-side superlattice layer 150, the light-emitting layer 160, the p-type cladding layer 170, and the p-type contact layer 180 are a semiconductor layer Epi. The n-type contact layer 130, the n-side electrostatic breakdown preventing layer 140, and the n-side superlattice layer 150 are n-type semiconductor layers. The p-type cladding layer 170, and the p-type contact layer 180 are p-type semiconductor layers. Moreover, the n-type semiconductor layer may include an ud-GaN layer which is not doped with a donor. The p-type semiconductor layer may include an ud-GaN layer which is not doped with an acceptor.

On the main surface of the substrate 110, a semiconductor layer Ep1 is formed in the order of the low-temperature buffer layer 120, the n-type contact layer 130, the n-side electrostatic breakdown preventing layer 140, the n-side superlattice layer 150, the light-emitting layer 160, the p-type cladding layer 170, and the p-type contact layer 180. The n-electrode N1 is formed on the n-type contact layer 130. The p-electrode P1 is formed on the transparent electrode 190.

The substrate 110 is a growth substrate. On the main surface of the substrate, the aforementioned semiconductor layers are formed through MOCVD. The main surface of the substrate may be roughened. The substrate 110 is made of sapphire. Other than sapphire, materials such as SiC, ZnO, Si, and GaN may be employed.

The low-temperature buffer layer 120 takes over the crystallinity from the substrate 110 and is provided so as to form thereon an upper layer. Thus, the low-temperature buffer layer 120 is disposed on the main surface of the substrate 110. The low-temperature buffer layer 120 is made of, for example, AlN or GaN.

The n-type contact layer 130 is provided so as to establish ohmic contact with the n-electrode N1. The n-type contact layer 130 is disposed on the low-temperature buffer layer 120. On the n-type contact layer 130, the n-electrode N1 is disposed. The n-type contact layer 130 is formed of n-type GaN and has a Si concentration of $1 \times 10^{18}/cm^3$ or greater. Alternatively, the n-type contact layer 130 may be formed of a plurality of layers having different carrier concentrations for enhancing ohmic contact with the n-electrode N1. The n-type contact layer 130 has a thickness of, for example, 1,000 nm and not more than 10,000 nm. Needless to say, other thickness values may be used.

The n-side electrostatic breakdown-preventing layer 140 serves as an electrostatic breakdown-preventing layer for preventing electrostatic breakdown of the semiconductor layers. The n-side electrostatic breakdown-preventing layer 140 is formed on the n-type contact layer 130. As shown in FIG. 2, the n-side electrostatic breakdown preventing layer 140 comprises an n-type GaN layer 141, an n-type GaN layer 142, an ud-GaN layer 143, and an n-type GaN layer 144. The n-type GaN layer 141 has a Si concentration of $2.5 \times 10^{17}/cm^3$, the n-type GaN layer 142 has a Si concentration from $2 \times 10^{18}/cm^3$ to $1.3 \times 10^{19}/cm^3$, the ud-GaN layer 143 is a GaN layer which is not intentionally doped (ud-GaN is an abbreviation for unintentionally doped GaN). The ud-GaN layer 143 has a donor, e.g., Si, concentration of $5 \times 10^{17}/cm^3$ or less. The n-type GaN layer 141 is formed on the n-type contact layer 130. The n-type GaN layer 142 is formed on the n-type GaN layer 141. The ud-GaN layer 143 is formed on the n-type GaN layer 142. The n-type GaN layer 144 is formed on the ud-GaN layer 143. The thickness of the n-type GaN layer 141 is, for example, 300 nm to 1,000 nm. The thickness of the n-type GaN layer 142 is, for example, 10 nm to 100 nm. The thickness of the ud-GaN layer 143 is, for example, 100 nm to 1,000 nm. The thickness of the n-type GaN layer 144 is, for example, 10 nm to 100 nm. These thickness values are examples only. Therefore, other values may be used.

The n-side superlattice layer 150 is a strain relaxation layer for relaxing the stress applied to the light-emitting layer 160. More specifically, the n-side superlattice layer 150 has a superlattice structure. The n-side superlattice layer 150 is disposed on the n-side electrostatic breakdown preventing layer 140. As shown in FIG. 2, the n-side superlattice layer 150 is formed by repeatedly depositing layer units, each layer unit formed by depositing an InGaN layer 151, a GaN layer 152, and an n-type GaN layer 153. The number of repetitions is 10 to 20. The number of repetitions may be any other number. The thickness of the InGaN layer 151 is, for example, 0.3 nm to 100 nm. The thickness of the GaN layer 152 is, for example, 0.3 nm to 10 nm. The thickness of the n-type GaN layer 153 is, for example, 0.3 nm to 100 nm. These thickness values are examples only. Therefore, other values may be used.

The light-emitting layer 160 emits light through recombination of electrons and holes. The light-emitting layer 160 is formed on the n-side superlattice layer 150. As shown in FIG. 2, the light-emitting layer 160 is formed by repeatedly depositing layer units, each layer unit formed by depositing a well layer 161, a capping layer 162, and a barrier layer 163. That is, the light-emitting layer 160 has a Multi Quantum Well structure (MQW structure). The capping layer 162 serves as a protective layer which protects the well layer 161 from heat. Specifically, the protective layer prevents sublimation of In in the well layer 161.

The number of repetitions is, for example, is 5 to 20. However, needless to say, the number of repetitions may be any other number. The well layer 161 is, for example, an InGaN layer. The capping layer 162 is, for example, a GaN layer. The barrier layer 163 is, for example, a GaN layer or an AlGaN layer. These are examples only.

The thickness of the well layer 161 is, for example, 1 nm to 5 nm. The thickness of the capping layer 162 is, for example, 0.2 nm to 1.8 nm. The thickness of the barrier layer 163 is, for example, 1 nm to 10 nm. These thickness values are given as examples, and values falling outside the ranges may be employed. The total thickness of the light-emitting layer 160 is 500 nm to 1,000 nm. Needless to say, any other total thickness may be used.

The p-type cladding layer 170 is formed on the light-emitting layer 160. As shown in FIG. 2, the p-type cladding layer 170 is formed by repeatedly depositing a p-type InGaN layer 171 and a p-type AlGaN layer 172. The number of repetitions is, for example, 5 to 20. However, needless to say, the number of repetitions may be any other number. The In composition ratio of the p-type InGaN layer 171 is 0.05 to 0.30. The thickness of the p-type InGaN layer 171 is 0.2 nm to 5 nm. The Al composition ratio of the p-type AlGaN layer 172 is 0.10 to 0.4. The thickness of the p-type AlGaN layer 172 is 1 nm to 5 nm. These values are given as examples, and values falling outside the ranges may be employed. Also, the structure of the p-type cladding layer 170 may differ from the one described above.

The p-type contact layer 180 is formed on the p-type cladding layer 170. The thickness of the p-type contact layer 180 is 10 nm to 100 nm. The p-type contact layer 180 is doped with Mg at a concentration of $1 \times 10^{19}/cm^3$ to $1 \times 10^{22}/cm^3$.

The transparent electrode 190 is disposed on the p-type contact layer 180. The material of the transparent electrode 190 is preferably any one of ITO, IZO, ICO, ZnO, $TiO_2$, $NbTiO_2$, $TaTiO_2$, and $SnO_2$.

The p-electrode P1 is disposed on the transparent electrode 190. The p-electrode P1 is formed of a Ni layer and an Au layer, sequentially deposited on the transparent electrode 190. Needless to say, any other structure may be used.

The n-electrode N1 is disposed on the n-type contact layer 130. The n-electrode N1 is formed of a V layer and an Al layer, sequentially deposited on the n-type contact layer 130. Alternatively, a Ti layer and an Al layer may be sequentially deposited in the same manner. Needless to say, any other structure may be used.

The light-emitting device 100 may include a protective film for protecting the semiconductor layer Ep1.

2. Pit Shape

Figure 3:
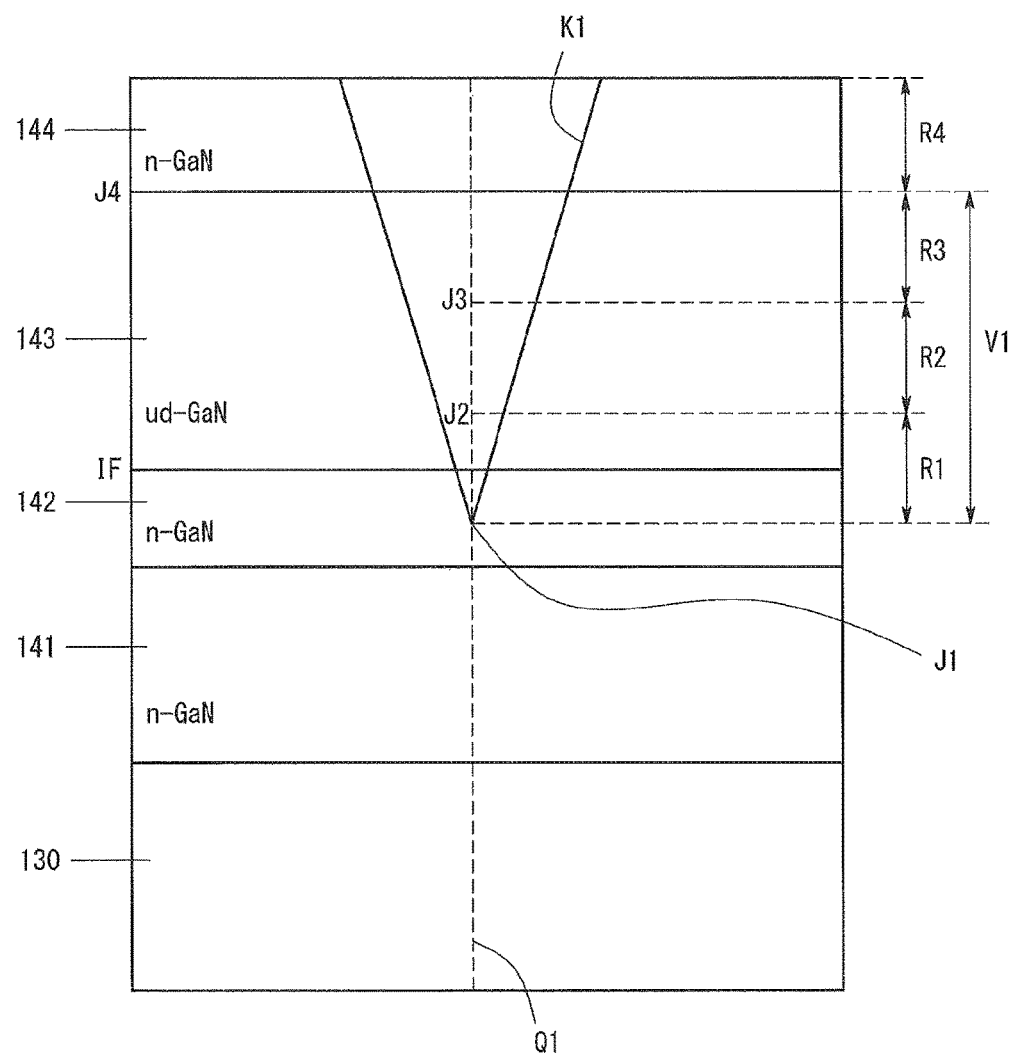
FIG. 3 is a sketch for describing a pit formed in the light-emitting device according to the embodiment.

FIG. 3 is a sketch showing a pit K1 of the light-emitting device 100. The light-emitting device 100 has a plurality of pits K1 extending from the n-type semiconductor layer to the p-type semiconductor layer. FIG. 3 illustrates only an extracted part of the n-type semiconductor layer. The pit K1 is formed at threading dislocation Q1 in forming the semiconductor layer Ep1 of the light-emitting device 100. The pit K1 is grown from the n-type GaN layer 142 of the n-side electrostatic breakdown preventing layer 140. That is, the threading dislocation growing upward on the substrate 110, extends laterally, i.e., in a direction perpendicular to the growth direction of the threading dislocation inside the n-side electrostatic breakdown preventing layer 140, resulting in the pit K1. The pit K1 is grown until it reaches the p-type contact layer 180.

The pit K1 starts to grow from the starting point J1 in the threading dislocation Q1. The semiconductor layer actually has a plurality of pits K1. The starting points J1 of these pits K1 are positioned at almost the same depths in the n-type GaN layer 142. The starting point J1 is positioned at a position entering the n-type GaN layer 142 side from an interface between the n-type GaN layer 142 and the ud-GaN layer 143 by a depth of approximately 5 nm to 30 nm. The position of the starting point J1 is controlled by a growth condition, e.g., growth temperature, pressure or growth rate. Especially the position of the starting point J1 is controlled by decreasing the growth temperature of the n-type GaN layer 142 from the growth temperature of the n-type GaN layer 141.

The diameter of the pit K1 varies with the thickness of the n-side electrostatic breakdown preventing layer 140 and the growth temperature of the n-side electrostatic breakdown preventing layer 140. As the thickness of the n-side electrostatic breakdown preventing layer 140 is increased, the pit diameter at the upper surface of the layer 140 is increased. On the contrary, as the thickness of the n-side electrostatic breakdown preventing layer 140 is decreased, the pit diameter is decreased. As the growth temperature of the n-side electrostatic breakdown preventing layer 140 is increased, the pit diameter is decreased. On the contrary, as the growth temperature of the n-side electrostatic breakdown preventing layer 140 is decreased, the pit diameter is increased.

3. In Doping to the N-Side Electrostatic Breakdown Preventing Layer

In the present embodiment, the semiconductor layer formed in an early generation stage of the pit K1 is doped with In. That is, the n-side electrostatic breakdown preventing layer 140 has the In-doped layer. The region doped with In of the n-side electrostatic breakdown preventing layer 140 has some variations.

3-1. Pit Formation Region

As shown in FIG. 3, the n-type GaN layer 142 and the ud-GaN layer 143 of the n-side electrostatic breakdown preventing layer 140 have a pit formation region V1 which is any one of a plurality of pits K1 formed. The pit K1 is actually formed from the n-type semiconductor layer to the p-type semiconductor layer. However, the pit formation region V1 of the present embodiment refers to a region of the n-type GaN layer 142 and the ud-GaN layer 143 where the pit K1 was formed. That is, the pit formation region V1 includes layers formed at an initial stage of generation of the pit K1. In the present embodiment, the In-doped layer exists inside the pit formation region V1.

The pit formation region V1 of the n-side electrostatic breakdown preventing layer 140 is virtually divided into three equal regions in a thickness direction. A region from the starting point J1 of the pit K1 to an interface J4 between the ud-GaN layer 143 and the n-type GaN layer 144 is divided into three equal regions. The thickness of the ud-GaN layer 143 is 315 nm. The starting point J1 is assumed to be disposed at a position of 15 nm from an interface (hereinafter, referred to as "IF") between the n-type GaN layer 142 and the ud-GaN layer 143. Therefore, the thickness of each divided region is 110 nm. Thus, the pit formation region V1 comprises a first region R1, a second region R2, and a third region R3 obtained by dividing the pit formation region V1 into three equal regions. The first region R1 is the region farthest from the light-emitting layer 160 of the pit formation region V1. The second region R2 is the region farthest next to the first region R1 from light-emitting layer 160 of the pit formation region V1. The third region R3 is the region farthest next to the second region R2 from the light-emitting layer 160 of the pit formation region V1. That is, the third region R3 is closest to the light-emitting layer 160 of the pit formation region V1.

3-2. First Method (First Region)

In the first method, the In-doped layer is the first region R1. The first region R1 comprises a part of the n-type GaN layer 142 and a part of the ud-GaN layer 143. The top surface J2 of the first region R1 is disposed at a position of 95 nm from the interface IF between the n-type GaN layer 142 and the ud-GaN layer 143. Therefore, the first region R1 is a region from the starting point J1 of the pit K1 to the top surface J2. In is doped from the starting point J1. However In may be doped from an area under the starting point J1 in the n-type GaN layer 142. The In composition ratio X of the first region R1 is, preferably, $0<X\leq 0.0035$, and more preferably, $0.001\leq X\leq 0.003$.

3-3. Second Method (Second Region)

In the second method, the In-doped layer is the second region R2. The second region R2 comprises a part of the ud-GaN layer 143. The top surface J3 of the second region R2 is disposed at a position of 205 nm from the interface IF between the n-type GaN layer 142 and the ud-GaN layer 143. Therefore, the second region R2 is a region having a thickness of 110 nm from the top surface J2 of the first region R1 to the top surface J3 of the second region R2. The In composition ratio X of the second region R2 is, preferably, $0<X\leq 0.0035$, and more preferably, $0.001\leq X\leq 0.003$.

3-4. Third Method (Third Region)

In the third method, the In-doped layer is the third region R3. The third region R3 comprises a part of the ud-GaN layer 143. The top surface J4 of the third region R3 is the interface between the ud-GaN layer 143 and the n-type GaN layer 144. Therefore, the third region R3 is a region having a thickness of 110 nm from the top surface J3 of the second region R2. The In composition ratio X of the third region R3 is, preferably, $0<X\leq 0.0035$, and more preferably, $0.001\leq X\leq 0.003$.

3-5. Fourth Method (In Doping Toward the Upper Layer from the Starting Point of the Pit)

In the fourth method, In doping is performed at a constant thickness toward the upper layer from the starting point J1 of the pit K1. The point to start In doping is the starting point J1 of the pit K1. The point to finish In doping is inside the ud-GaN layer 143. Therefore, the first end surface in a thickness direction of the In-doped layer is a surface containing the starting points J1 of the pits K1 in the n-type GaN layer 142. The second end surface in a thickness direction of the In-doped layer is inside the ud-GaN layer 143. The thickness of the In-doped layer in the ud-GaN layer 143 is 100 nm to 200 nm. Therefore, the second end surface is disposed in the first region R1 or the second region R2. The In composition ratio X is preferably, 0<X≤0.0035, and more preferably, 0.001≤X≤0.003.

3-6. Fifth Method (In Doping Toward the Upper Layer from the Starting Point of the Pit)

In the fifth method, similarly as in the fourth method, In doping is performed at a constant thickness larger than that of the fourth method toward the upper layer from the starting point J1 of the pit K1. The point to start In doping is the starting point J1 of the pit K1. The point to finish In doping is inside the ud-GaN layer 143. Therefore, the first end surface in a thickness direction of the In-doped layer is a surface containing the starting points J1 of the pits K1 in the n-type GaN layer 142. The second end surface in a thickness direction of the In-doped layer is inside the ud-GaN layer 143. The thickness of the In-doped layer in the ud-GaN layer 143 is 200 nm to 300 nm. Therefore, the second end surface is disposed in the second region R2 or the third region R3. The In composition ratio X is preferably, 0<X≤0.0035, and more preferably, 0.001≤X≤0.003.

3-7. In Doping Method in the Present Embodiment

In this way, in the present embodiment, the n-side electrostatic breakdown preventing layer 140 of the n-type semiconductor layer includes the n-type GaN layer 142 (first semiconductor layer) containing the starting points J1 of the pits K1, and the ud-GaN layer 143 (second semiconductor layer) disposed adjacent to the n-type GaN layer 142 and containing a part of the pits K1. At least one of the n-type GaN layer 142 (first semiconductor layer) and the ud-GaN layer 143 (second semiconductor layer) has the In-doped layer. The In composition ratio X of the In-doped layer is more than 0 and not more than 0.0035.

3-8. Effect of In Doping to the N-Side Electrostatic Breakdown Preventing Layer

As described above, the n-side electrostatic breakdown preventing layer 140 formed in an early generation stage of the pit K1 is doped with In, thereby a potential barrier is formed in the vicinity of the pit K1. As a result, carriers hardly exist in the vicinity of the pit K1. That is, carriers exist at a position distant from the threading dislocation Q1. The threading dislocation Q1 plays an important role in non-light-emitting recombination. Non-light-emitting recombination can be suppressed by In doping. As a result, the emission efficiency of the light-emitting device 100 is improved.

A surfactant effect is exerted by In doping. This makes the top surface of each layer of the n-side electrostatic breakdown preventing layer 140 flat. Thus, flat semiconductor layers can be formed. The emission efficiency of the light-emitting device 100 is improved. However, in some cases, the diameter of the pit K1 is reduced due to the surfactant effect. When the diameter of the pit K1 is reduced, the drive voltage Vf is increased accordingly.

4. Method for Producing a Semiconductor Light-Emitting Device

A description will next be given of a method for producing the light-emitting device 100 according to the present embodiment. Crystals forming the semiconductor layers are formed by epitaxial growth using Metal Organic Chemical Vapor Deposition (MOCVD). The carrier gas used is hydrogen ($H_2$), nitrogen ($N_2$), or a gas mixture of hydrogen and nitrogen ($H_2+N_2$). Ammonia gas ($NH_3$) is used as a nitrogen source. Trimethylgallium ($Ga(CH_3)_3$) is used as a Ga source. Trimethylindium ($In(CH_3)_3$) is used as an In source. Trimethylaluminum ($Al(CH_3)_3$) is used as an Al source. Silane ($SiH_4$) is used as an n-type dopant gas. Bis(cyclopentadienyl)magnesium ($Mg(C_5H_5)_2$) is used as the p-type dopant gas. Any gas other than the above may be used.

4-1. N-Type Contact Layer Formation Step

Firstly, a low-temperature buffer layer 120 is formed on a main surface of a substrate 110. An n-type contact layer 130 is formed on a buffer layer 120. The temperature of the substrate in this process is 1,080° C. to 1,140° C.

4-2. N-Side Electrostatic Breakdown Preventing Layer Formation Step

Figure 4:
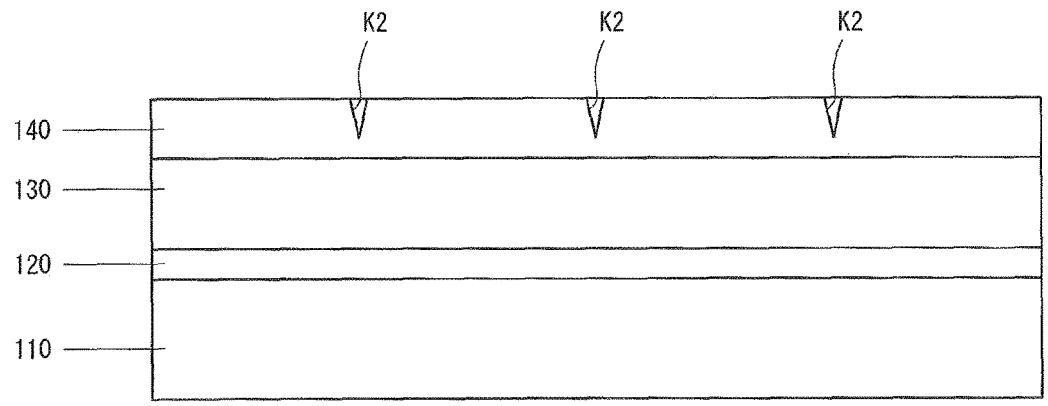
FIG. 4 is a sketch (No. 1) for describing a method for producing a light-emitting device according to an embodiment.

Next, an n-side electrostatic breakdown preventing layer 140 is formed on the n-type contact layer 130. Firstly, an n-type GaN layer 141 is formed by the supply of silane ($SiH_4$). Then, an n-type GaN layer 142 is formed by the supply of silane ($SiH_4$). The supply of silane ($SiH_4$) is stopped, and an ud-GaN layer 143 is formed. Then, an n-type GaN layer 144 is formed by supplying silane ($SiH_4$) again. The temperature of the substrate in the process for growing the n-type GaN layer 141 is any temperature in a range of 1,080° C. to 1,140° C. as same as the growth temperature of the n-type contact layer 130. The temperature of the substrate in the process for growing the n-type GaN layer 142, the ud-GaN layer 143 and the n-type GaN layer 144 is 750° C. to 950° C. In this process, as shown in FIG. 4, pits K2 are formed. The pits K2 are grown with the subsequent growth of the semiconductor layer, resulting in pits K1. In this way, while forming the pits K2, the n-side electrostatic breakdown preventing layer 140 is formed. When the pit formation region V1 of the n-side electrostatic breakdown preventing layer 140 is formed, trimethylindium ($In(CH_3)_3$) is supplied to a specified region. Thereby, the specified region of the pit formation region V1 is doped with In.

4-3. N-Side Superlattice Layer Formation Step

Next, an n-side superlattice layer 150 is formed. Firstly, an InGaN layer 151 is formed on the n-type GaN layer 144 of the n-side electrostatic breakdown preventing layer 140. Then, a GaN layer 152 is formed on the InGaN layer 151. An n-type GaN layer 153 is formed on the GaN layer 152. In this way, a layer unit of the InGaN layer 151, the GaN layer 152, and the n-type GaN layer 153 is repeatedly deposited.

4-4. Light-Emitting Layer Formations Step

Next, a light-emitting layer 160 is formed on the n-side superlattice layer 150. For that purpose, a layer unit of the well layer 161, the capping layer 162, and the barrier layer 163 deposited in this order is repeatedly deposited. That is, the light-emitting layer formation step comprises a well layer formation step of forming a well layer 161, a capping layer formation step of forming a capping layer 162 on the well layer 161, and a barrier layer formation step of forming a barrier layer 163 on the capping layer 162. These steps are repeatedly performed. Therefore, the well layer 161 is formed on the barrier layer 163 again. The temperature of the substrate in growing the well layer 161 is set to 730° C. to 850° C.

4-5. P-Type Cladding Layer Formation Step

Next, a p-type cladding layer 170 is formed on the light-emitting layer 160. Here, a p-type AlGaN layer 171 and a p-type InGaN layer 172 are repeatedly deposited.

4-6. P-Type Contact Layer Formation Step

Figure 5:
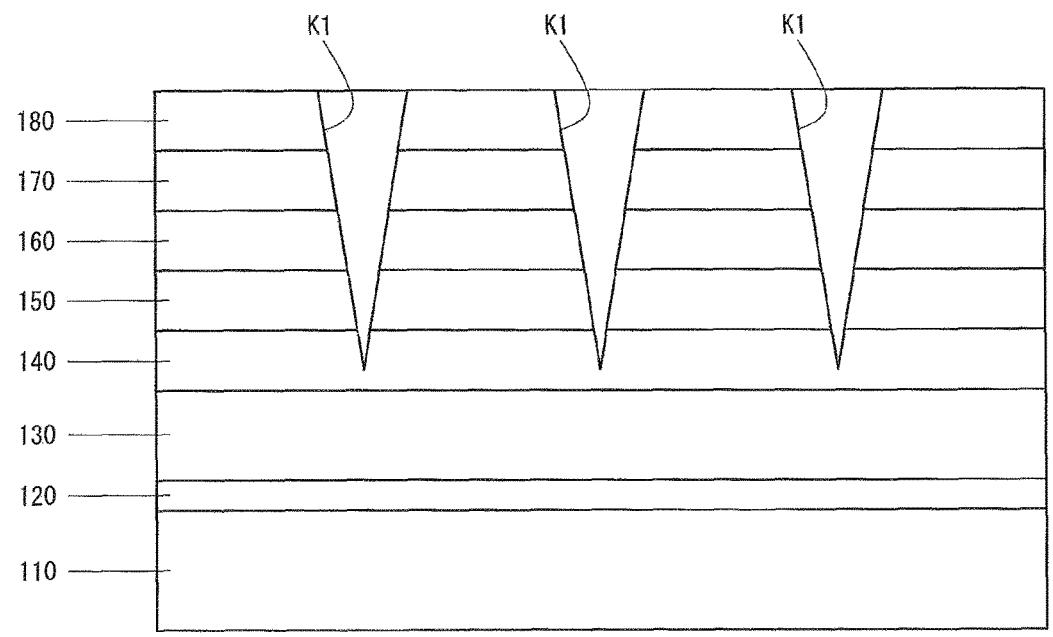
FIG. 5 is a sketch (No. 2) for describing a method for producing a light-emitting device according to an embodiment.

Next, a p-type contact layer 180 is formed on the p-type cladding layer 170. The temperature of the substrate in this process is set to 900° C. to 1,050° C. Thus, as shown in FIG. 5, the semiconductor layers are deposited on the substrate 110. The pits K1 are formed so as to extend from the n-side electrostatic breakdown preventing layer 140 to the p-type contact layer 180.

4-7. Transparent Electrode Formation Step

Next, a transparent electrode 190 is formed on the p-type contact layer 180.

4-8. Electrode Formation Step

Next, a p-electrode P1 is formed on the transparent electrode 190. Then, a part of the semiconductor layers are removed from the p-type contact layer 180 side using a laser or by etching to expose the n-type contact layer 130. Then an n-electrode N1 is formed on the exposed portion of the n-type contact layer 130. The step of forming a p-electrode P1 may be performed before the step of forming an n-electrode N1, or the step of forming an n-electrode N1 may be performed before the step of forming a p-electrode P1.

4-9. Other Steps

In addition to the steps described above, other steps such as a heat treatment step and an insulating film formation step may be performed. Through the steps described above, the light-emitting device 100 shown in FIG. 1 is produced.

5. Experiments

5-1. Comparison from the First Region to the Third Region

Next will be described the total radiant flux Po and the drive voltage Vf when only one of the first region R1 to the third region R3 is doped with In. For example, when the first region R1 is doped with In, the second region R2 and the third region R3 are not doped with In.

Figure 6:
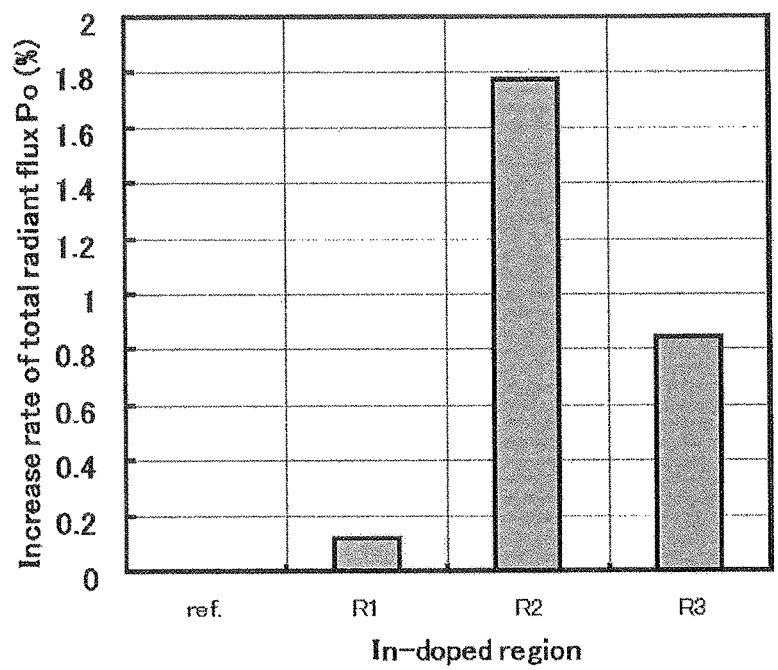
FIG. 6 is a graph showing the relationship between the In-doped region and the total radiant flux Po.

FIG. 6 is a graph showing the relationship between the In-doped region and the increase rate of the total radiant flux Po. The vertical axis of FIG. 6 indicates of the total radiant flux Po, that is, the rate of deviation (increase amount) to the total radiant flux when the region is not doped with In. The first bar (R1) from the left in FIG. 6, is the increase rate of the total radiant flux Po when the first region R1 was doped with In. The second bar (R2) from the left in FIG. 6, is the increase rate of the total radiant flux Po when the second region R2 was doped with In. The third bar (R3) from the left in FIG. 6, is the increase rate of the total radiant flux Po when the third region R3 was doped with In. The In composition ratio is 0.003 (0.3%) in the above three cases.

As shown in FIG. 6, when the first region R1 was doped with In, the total radiant flux Po was increased, i.e., improved, by 0.1%. When the second region R2 was doped with In, the total radiant flux Po was increased by 1.8%. When the third region R3 was doped with In, the total radiant flux Po was increased by 0.8%. In this way, when the second region R2 was doped with In, the total radiant flux Po was increased, i.e., improved, most.

Figure 7:
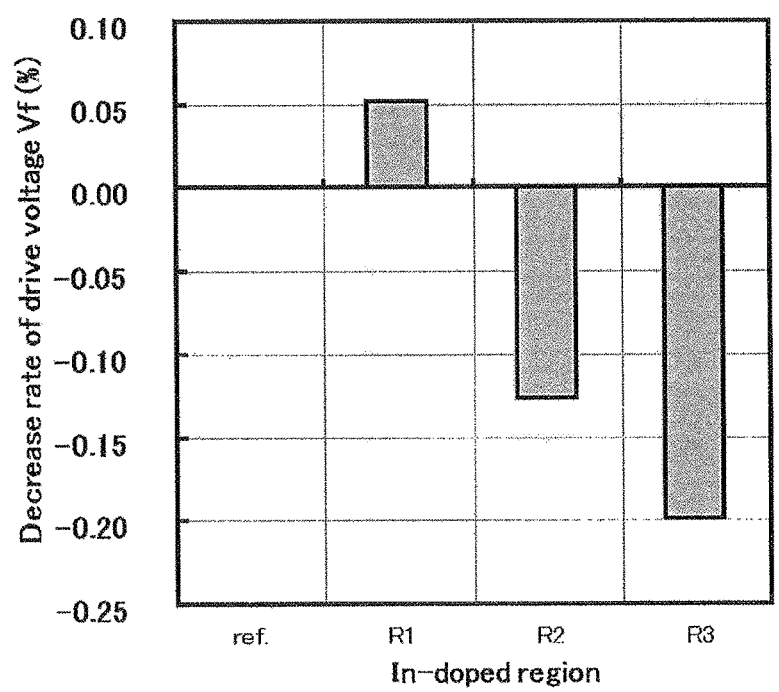
FIG. 7 is a graph showing the relationship between the In-doped region and the drive voltage Vf.

FIG. 7 is a graph showing the relationship between the In-doped region and the decrease rate of the drive voltage Vf. The vertical axis of FIG. 7 indicates the decrease rate of the drive voltage Vf, that is, the rate of deviation (decrease amount) to the drive voltage VF when the region is not doped with In. The first bar (R1) from the left in FIG. 7 is the decrease rate of the drive voltage Vf when the first region R1 was doped with In. The second bar (R2) from the left in FIG. 7 is the decrease rate of the drive voltage Vf when the second region R2 was doped with In. The third bar (R3) from the left in FIG. 7 is the decrease rate of the drive voltage Vf when the third region R3 was doped with In. Therefore, when it is a positive value, it means that the drive voltage Vf was decreased, i.e., improved. The In composition ratio is 0.003 (0.3%) in the above three cases.

As shown in FIG. 7, when the first region R1 was doped with In, the drive voltage Vf was reduced by 0.05%. When the second region R2 was doped with In, the drive voltage Vf was increased by 0.13%. When the third region R3 was doped with In, the drive voltage Vf was increased by 0.20%. In this way, when the first region R1 was doped with In, the drive voltage Vf was decreased, i.e., improved, most.

To improve both the total radiant flux Po and the drive voltage Vf, the first region R1 is preferably doped with In. On the other hand, to improve the total radiant flux Po even though the drive voltage Vf is slightly sacrificed, the second region R2 is preferably doped with In. When the third region R3 was doped with In, the total radiant flux Po is improved to some extent. However, the increase of the drive voltage Vf is the largest.

5-2. In Doping Amount

Figure 8:
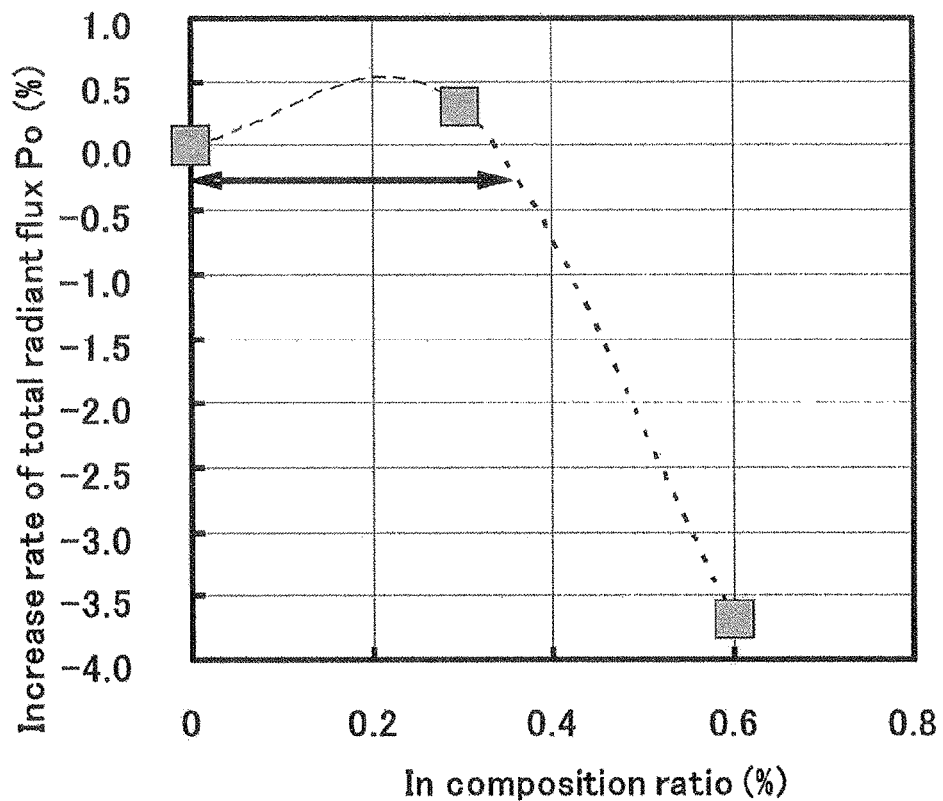
FIG. 8 is a graph showing the relationship between the In doping amount and the increase rate of total radiant flux Po.

FIG. 8 is a graph showing the relationship between the In doping amount and the increase rate of total radiant flux Po. The vertical axis of FIG. 8 indicates of the total radiant flux Po, that is, the rate of deviation (increase amount) to the total radiant flux when the region is not doped with In. The horizontal axis of FIG. 8 indicates the In composition ratio of the In-doped n-side electrostatic breakdown preventing layer, i.e., the In-doped region. The region doped with In is the region covering from the first region R1 to the third region R3. As shown in FIG. 8, when the In composition ratio X is $0<X\leq0.0035$, the total radiant flux Po is increased, i.e., improved. Therefore, the In composition ratio X is $0<X\leq0.0035$. When the In composition ratio X is $0.001\leq X\leq0.003$, the total radiant flux Po is increased, i.e., improved, by 0.2% or more. The In composition ratio X is, preferably, $0.001\leq X\leq0.003$.

5-3. In Doping to the Fourth Region

Figure 9:
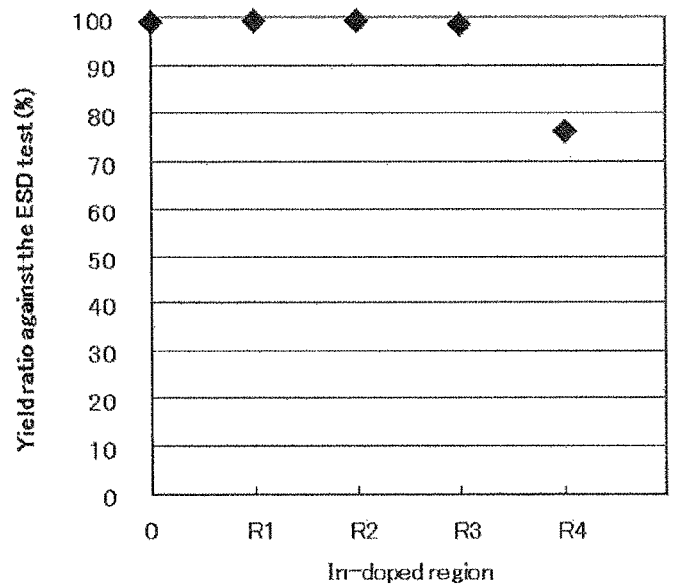
FIG. 9 is a graph showing the relationship between the In-doped region and the yield ratio against the ESD test.

FIG. 9 is a graph showing the relationship between the In-doped region and the yield ratio which is the ratio of the devices not broken down in the electrostatic discharge (ESD) test. The horizontal axis of FIG. 9 indicates the In-doped region. The vertical axis of FIG. 9 indicates the yield ratio against the ESD test. The first region R1, the second region R2, the third region R3, and the fourth region R4 were doped with In, respectively. The fourth region R4 is the n-type GaN layer 144. The fourth region R4 is closer to the light-emitting layer 160 than the ud-GaN layer 143.

As shown in FIG. 9, when a respective one region of the first region R1, the second region R2, and the third region R3 were doped with In, the yield ratio against the ESD test is almost 100%. When only the fourth region R4, that is, the n-type GaN layer 144 was doped with In, the yield ratio against the ESD test is approximately 76%. The yield ratio against the ESD test is reduced. Therefore, the fourth region R4 is preferably not to be doped with In.

5-4. In Doping to the Upper Layer from the Starting Points of the Pits

Figure 10:
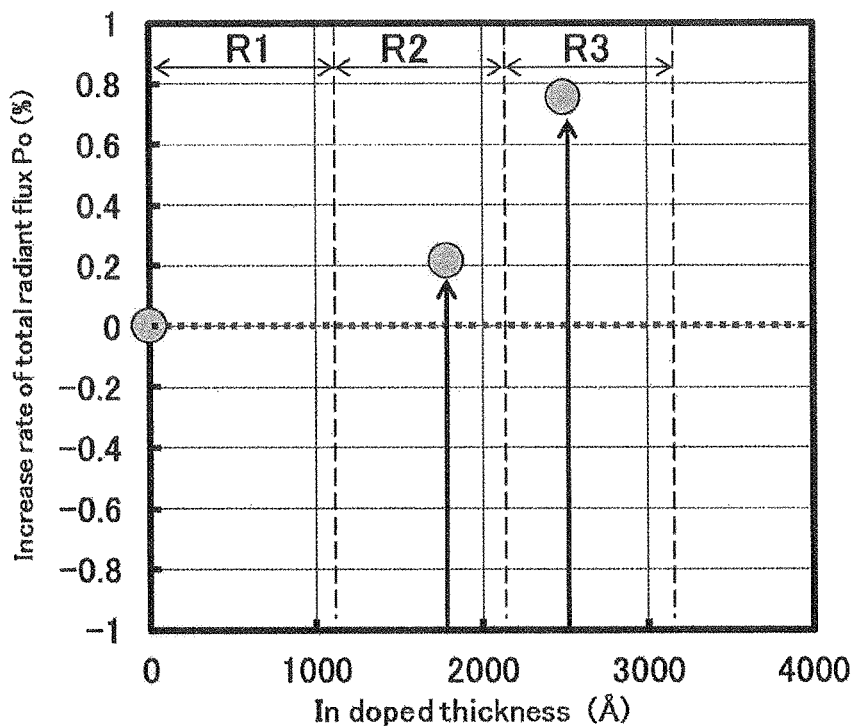
FIG. 10 is a graph showing the relationship between the film thickness when In doping was performed toward the upper layer from the starting point J1 of the pit K1 and the increase rate of the total radiant flux Po.

FIG. 10 is a graph showing the relationship between the thickness when In doping was continuously performed toward the upper layer from the starting points J1 of the pits K1 and the increase rate of the total radiant flux Po. In FIG. 10, In doping was continuously performed from the starting points J1 of the pits K1 of the n-type GaN layer 142 to the ud-GaN layer 143. The horizontal axis of FIG. 10 indicates the In doped thickness in the ud-GaN layer 143, i.e., the thickness from the interface IF. That is, when the thickness as the horizontal axis of FIG. 10 is 0 Å, the pit formation region V1 of the n-type GaN layer 142 is doped with In, but the ud-GaN layer 143 is not doped with In.

As shown in FIG. 10, when In doping was continuously performed to the ud-GaN layer 143 up to 179 nm from the interface IF between the n-type GaN layer 142 and the ud-GaN layer 143, the increase rate of the total radiant flux Po was 0.21%. At this time, the first region R1 and a part of the second region R2 are doped with In. When In doping was continuously performed to the ud-GaN layer 143 up to 250 nm from the interface IF, the increase rate of the total radiant flux Po was 0.75%. At this time, the first region R1, the second region R2, and a part of the third region R3 are doped with In. Therefore, In doping is preferably performed to the ud-GaN layer 143 up to 250 nm from the interface IF.

Figure 11:
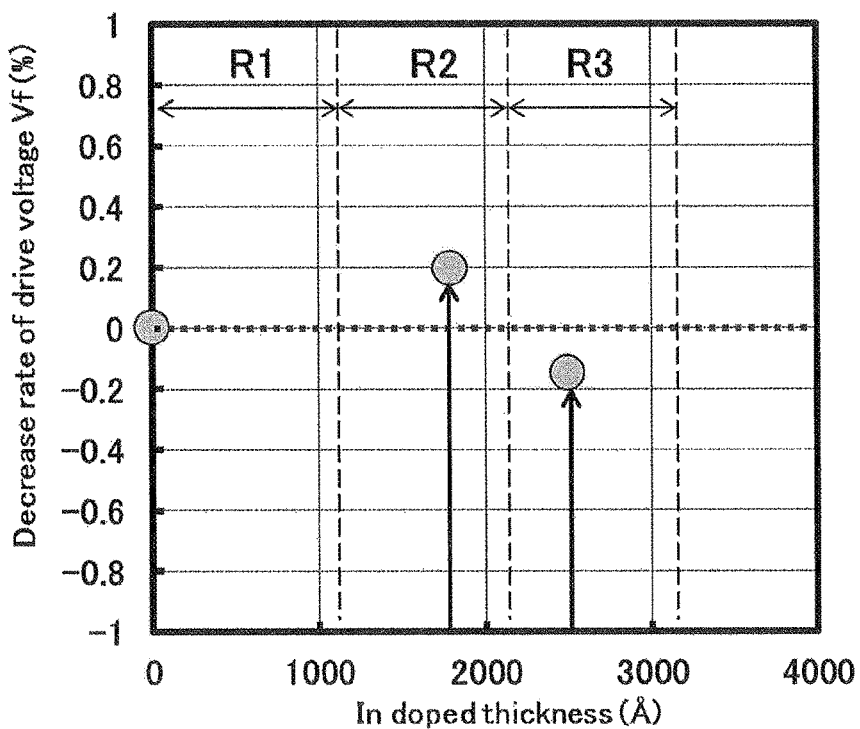
FIG. 11 is a graph showing the relationship between the thickness when In doping was performed toward the upper layer from the starting points J1 of the pits K1 and the decrease rate of the drive voltage Vf.

FIG. 11 is a graph showing the relationship between the thickness when In doping was continuously performed toward the upper layer from the starting points J1 of the pits K1 and the decrease rate of the drive voltage Vf. The horizontal axis of FIG. 11 is the same as the horizontal axis of FIG. 10.

As shown in FIG. 11, when In doping was continuously performed to the ud-GaN layer 143 up to 179 nm from the interface IF, the decrease rate of the drive voltage Vf was 0.20%. When In doping was continuously performed to the ud-GaN layer 143 up to 250 nm from the interface IF, the decrease rate of the drive voltage Vf was −0.15%. That is, the increase rate of the drive voltage Vf was 0.15%. Therefore, in terms of drive voltage Vf, In doping is preferably performed to the ud-GaN layer 143 up to 179 nm from the interface IF.

To improve both the total radiant flux Po and the drive voltage Vf, In doping is preferably performed to the ud-GaN layer 143 up to 179 nm from the interface IF. That is, In doping is preferably performed to the region having the pits K1 of the n-type GaN layer 142 and the region of the ud-GaN layer 143 from 100 nm to 200 nm from the interface IF.

To improve the total radiant flux Po even though the drive voltage Vf is slightly sacrificed, In doping is continuously performed to the ud-GaN layer 143, preferably, up to 250 nm from the interface IF. That is, In doping is preferably performed to the region having the pits K1 of the n-type GaN layer 142 and the region of the ud-GaN layer 143 from 200 nm to 300 nm from the interface IF.

As described above, the total radiant flux Po and the drive voltage Vf complicatedly vary depending on which region is doped with In. This is considered to be a result from complex entanglement of the factors: (1) non-light-emitting recombination is suppressed by the potential barrier of In and (2) the flatness of the semiconductor layer is improved by the surfactant effect of In.

6. Variations 6-1. Filling in Pit

In the present embodiment, the pits K1 extend from the n-side electrostatic breakdown preventing layer 140 to the p-type contact layer 180. However, the pits K1 may be filled when they reached the p-type cladding layer 170. The pits K1 are still formed so as to extend from the n-type semiconductor layer to the p-type semiconductor layer. Thus, the pits K1 may be filled at the middle of the p-type semiconductor layer.

6-2. Light-Emitting Layer

In the present embodiment, the light-emitting layer 160 is formed by repeatedly depositing a layer unit of the well layer 161, the capping layer 162, and the barrier layer 163 sequentially deposited. However, the capping layer 162 may be omitted. In that case, a layer unit of the well layer 161 and the barrier layer 163 is repeatedly deposited.

6-3. Flip Chip

In the present embodiment, the light-emitting device 100 is of a face-up type. However, the technique of the present embodiment is applicable to a flip-chip type light-emitting device.

6-4. N-Side Electrostatic Breakdown Preventing Layer

In the present embodiment, the n-side electrostatic breakdown preventing layer 140 has a four-layer structure. However, other structure may be employed. The n-side electrostatic breakdown preventing layer 140 may comprise a first semiconductor layer containing the starting points J1 of the pits K1, and the subsequent second semiconductor layer.

7. Summary of the Present Embodiment

As described above in detail, in the light-emitting device 100 of the present embodiment, the n-side electrostatic breakdown preventing layer 140 is doped with In. The In composition ratio X is $0<X\leq0.0035$. Thereby, recombination of electrons and holes in the threading dislocation Q1 is suppressed by the potential barrier of In. The total radiant flux of the light-emitting device 100 is improved. Moreover, the flatness of the semiconductor layers above the n-side electrostatic breakdown preventing layer 140 is improved by the surfactant effect of In. The total radiant flux of the light-emitting device 100 is improved.

The above-described embodiment is merely an example. Accordingly, needless to say, the embodiment may be improved or modified in various ways without departing from the scope of the present techniques. The depositing structure of the layered body is not necessarily limited to the above-illustrated structure. The depositing structure, the number of repetitions of layers, etc. may be freely selected. The vapor deposition method is not limited to the metal organic chemical vapor deposition (MOCVD). Any other vapor deposition method may be used so long as it uses a carrier gas to grow crystals. The semiconductor layers may be through another epitaxial growth method such as liquid-phase epitaxy or molecular beam epitaxy.

What is claimed is:

1. A Group III nitride semiconductor light-emitting device comprising an n-type semiconductor layer, a light-emitting layer on the n-type semiconductor layer, a p-type semiconductor layer on the light-emitting layer:

wherein there is a plurality of pits extending from the n-type semiconductor layer to the p-type semiconductor layer;

the n-type semiconductor layer includes a first semiconductor layer containing starting points of the pits, and a second semiconductor layer disposed adjacent to the first semiconductor layer and containing a part of the pits;

at least one of the first semiconductor layer and the second semiconductor layer has an In-doped layer of Group III nitride semiconductor; and the In-doped layer has an In composition ratio of more than 0 and not more than 0.0035.

2. The Group III nitride semiconductor light-emitting device according to claim 1, wherein the n-type semiconductor layer includes an n-side electrostatic breakdown preventing layer;

the n-side electrostatic breakdown preventing layer comprises the first semiconductor layer and the second semiconductor layer;

the first semiconductor layer is an n-type GaN layer; and
the second semiconductor layer is an ud-GaN layer.

3. The Group III nitride semiconductor light-emitting device according to claim 1, wherein the first semiconductor layer is doped with Si and the second semiconductor layer is not doped with Si.

4. The Group III nitride semiconductor light-emitting device according to claim 1,
wherein the first semiconductor layer and the second semiconductor layer have a pit formation region in which the pits are formed;
the pit formation region comprises a first region, a second region, and a third region obtained by dividing the pit formation region into three equal regions in a thickness direction;
the first region is the region farthest from the light-emitting layer;
the second region is the region farthest next to the first region from the light-emitting layer;
the third region is the region farthest next to the second region from the light-emitting layer; and
wherein the In-doped layer is only one region selected from a group consisting of the first region, the second region and the third region.

5. The Group III nitride semiconductor light-emitting device according to claim 2,
wherein the first semiconductor layer and the second semiconductor layer have a pit formation region in which the pits are formed;
the pit formation region comprises a first region, a second region, and a third region obtained by dividing the pit formation region into three equal regions in a thickness direction;
the first region is the region farthest from the light-emitting layer;
the second region is the region farthest next to the first region from the light-emitting layer;
the third region is the region farthest next to the second region from the light-emitting layer; and
wherein the In-doped layer is only one region selected from a group consisting of the first region, the second region and the third region.

6. The Group III nitride semiconductor light-emitting device according to claim 1, wherein the first end surface in a thickness direction of the In-doped layer is a surface containing the starting points of the pits in the first semiconductor layer;
the second end surface in a thickness direction of the In-doped layer is inside the second semiconductor layer; and
the thickness of the In-doped layer in the second semiconductor layer is 100 nm to 200 nm.

7. The Group III nitride semiconductor light-emitting device according to claim 2, wherein the first end surface in a thickness direction of the In-doped layer is a surface containing the starting points of the pits in the first semiconductor layer;
the second end surface in a thickness direction of the In-doped layer is inside the second semiconductor layer; and
the thickness of the In-doped layer in the second semiconductor layer is 100 nm to 200 nm.

8. The Group III nitride semiconductor light-emitting device according to claim 1, wherein the first end surface in a thickness direction of the In-doped layer is a surface containing the starting points of the pits in the first semiconductor layer;
the second end surface in a thickness direction of the In-doped layer is inside the second semiconductor layer; and
the thickness of the In-doped layer in the second semiconductor layer is 200 nm to 300 nm.

9. The Group III nitride semiconductor light-emitting device according to claim 2, wherein the first end surface in a thickness direction of the In-doped layer is a surface containing the starting points of the pits in the first semiconductor layer;
the second end surface in a thickness direction of the In-doped layer is inside the second semiconductor layer; and
the thickness of the In-doped layer in the second semiconductor layer is 200 nm to 300 nm.

10. The Group III nitride semiconductor light-emitting device according to claim 1, wherein the In composition ratio of the In-doped layer is more than 0.001 and not more than 0.003.

11. The Group III nitride semiconductor light-emitting device according to claim 2, wherein the In composition ratio of the In-doped layer is more than 0.001 and not more than 0.003.

12. The Group III nitride semiconductor light-emitting device according to claim 1, wherein the In-doped layer is started from a point of 5 nm to 50 nm under an interface between the first semiconductor layer and the second semiconductor layer.

13. The Group III nitride semiconductor light-emitting device according to claim 2, wherein the In-doped layer is started from a point of 5 nm to 50 nm under an interface between the first semiconductor layer and the second semiconductor layer.

14. The Group III nitride semiconductor light-emitting device according to claim 3, wherein the In-doped layer is started from a point of 5 nm to 50 nm under an interface between the first semiconductor layer and the second semiconductor layer.

* * * * *